(12) United States Patent
Weiner

(10) Patent No.: US 8,331,196 B2
(45) Date of Patent: Dec. 11, 2012

(54) SYSTEM AND METHOD FOR CONTROLLING AN ACOUSTIC TRANSDUCER

(75) Inventor: Nathan K. Weiner, Upton, MA (US)

(73) Assignee: Covaris, Inc., Woburn, MA (US)

( * ) Notice: Subject to any disclaimer, the term of this patent is extended or adjusted under 35 U.S.C. 154(b) by 252 days.

(21) Appl. No.: 12/755,481

(22) Filed: Apr. 7, 2010

(65) Prior Publication Data

US 2010/0260012 A1     Oct. 14, 2010

Related U.S. Application Data

(60) Provisional application No. 61/169,036, filed on Apr. 14, 2009.

(51) Int. Cl.
*H04B 1/02* (2006.01)
(52) U.S. Cl. ...................................................... 367/137
(58) Field of Classification Search .................... 367/137
See application file for complete search history.

(56) References Cited

U.S. PATENT DOCUMENTS

| | | |
|---|---|---|
| 5,140,231 A | 8/1992 | Kashiyama |
| 5,168,437 A | 12/1992 | Gyugyi et al. |
| 5,550,697 A | 8/1996 | Green et al. |
| 5,834,871 A | 11/1998 | Puskas |
| 6,577,487 B2 | 6/2003 | Gertmar |
| 6,836,054 B2 | 12/2004 | Boyd |
| 7,312,554 B2 | 12/2007 | Vogeley |
| 2002/0096970 A1 | 7/2002 | Hayashi et al. |
| 2003/0025124 A1 | 2/2003 | Deboy |
| 2003/0132211 A1* | 7/2003 | Aigner ..................... 219/130.21 |
| 2006/0267523 A1 | 11/2006 | Seelig et al. |

OTHER PUBLICATIONS

European Search Report, Application No. 10159761.5 dated Sep. 8, 2010.

* cited by examiner

*Primary Examiner* — Isam Alsomiri
*Assistant Examiner* — James Hulka
(74) *Attorney, Agent, or Firm* — Wolf, Greenfield & Sacks, P.C.

(57) ABSTRACT

A system and method for controlling operation of a transducer circuit, e.g., including an acoustic transducer arranged to cause mixing, cavitation or other movement in a liquid contained in a vessel located remote from the transducer. A load current of a transformer used to generate a drive signal for the transducer may be controlled to vary sinusoidally, to vary between negative and positive values and such that the load current flows in a closed loop when a zero voltage bias is applied across the primary transformer winding, to have a reduced or eliminated $3^{rd}$ harmonic mode and/or to vary between three discrete modes including a forward current mode, a zero voltage loop current mode, and a freewheel current mode. An inverter circuit may be used to control the load current, e.g., so that the load current flows in a closed loop during portions of the control cycle.

29 Claims, 4 Drawing Sheets

SYSTEM AND METHOD FOR CONTROLLING AN ACOUSTIC TRANSDUCER

BACKGROUND

1. Field of Invention

This invention relates to control of an acoustic transducer.

2. Related Art

Acoustic treatment systems are used to expose samples, such as DNA or other genetic material, bone or other tissue material, leaves, seeds or other plant material, cells, and other substances to an acoustic field. In some arrangements, the acoustic energy can be relatively intense, causing the sample material to be fragmented, lysed, or otherwise disrupted. For example, a sample containing a plurality of cells may be exposed to acoustic treatment such that cell membranes and other components are broken down or otherwise degraded so that DNA or other genetic material is released into a liquid. The genetic material may then be collected and used for various types of analysis. Acoustic treatment systems generate a suitable acoustic field for these processes using an acoustic transducer. The acoustic field may be focused or otherwise arranged so as to cause the desired affect on sample material. Examples of such systems are described in U.S. Pat. Nos. 6,948,843 and 6,719,449.

SUMMARY OF INVENTION

Aspects of the invention relate to the control of an acoustic transducer, or at least the generation of a drive signal that may be used to excite an acoustic transducer. Although the acoustic transducer may be used for a variety of different purposes, in some embodiments the acoustic transducer may be used to generate acoustic energy for treating a sample material contained in a vessel, such as a tube or well in a microtiter plate. In at least one embodiment, the acoustic energy may be suitable to cause mixing, cavitation or other movement in a liquid contained in the vessel. Some aspects of the invention may generate reduced electrical noise and/or reduce power requirements, e.g., due to more efficient generation of a drive signal for an acoustic transducer circuit. For example, a load current in a transformer used to generate a drive signal for an acoustic transducer circuit may be controlled to be approximately sinusoidal, requiring less power to generate the load current and thereby reducing noise generated by the transformer and associated circuitry. In other embodiments, one or more harmonic modes, such as a $3^{rd}$ order harmonic mode, may be reduced or eliminated from a load current, thus helping to avoid the generation of a drive signal that may excite a corresponding mode in the acoustic transducer.

In one aspect of the invention, a system for controlling an acoustic transducer includes a two-winding transformer that includes a primary winding and a secondary winding, a load current control circuit including a plurality of transistor switches and a plurality of diodes connected to the primary winding of the two-winding transformer, a voltage supply connected to the load current control circuit, and a control circuit that controls the plurality of transistor switches such that a load current in the primary winding varies between negative and positive values, e.g., approximately sinusoidally, and such that the load current flows in a closed loop when a zero voltage bias is applied by the load current control circuit across the primary winding. A secondary winding of the transformer may have a first terminal connected to a first terminal of an acoustic transducer circuit, and a second terminal connected to a second terminal of the acoustic transducer circuit. The acoustic transducer circuit may include a matching network connected to the secondary winding of the transformer and at least one acoustic transducer arranged to generate an acoustic waveform in response to a suitable drive signal received from the matching network.

In another aspect of the invention, a load current control circuit may include an inverter circuit having four diode/switch pairs, each pair having a diode connected across high-side and low-side terminals of a corresponding switch. The first and third diode/switch pairs may have the high-side terminals of their switches connected together, the second and fourth diode/switch pairs may have the low-side terminals of their switches connected together, the low-side terminal of the first diode/switch pair and the high-side terminal of the fourth diode/switch pair may be connected together and connected to a first terminal of a primary winding of a two-winding transformer that is coupled to an acoustic transducer circuit, and the high-side terminal of the second diode/switch pair and low-side terminal of the third diode/switch pair may be connected together and connected to a second terminal of the primary winding of the two-winding transformer. A control circuit may control the opening and closing of the switches of the diode/switch pairs to control current flow through the primary winding of the two-winding transformer, e.g., to vary sinusoidally, to have a reduced or eliminated $3^{rd}$ harmonic mode and/or to vary between three discrete modes including a forward current mode, a zero voltage loop current mode, and a freewheel current mode.

These and other aspects of the invention will be appreciated from the following description and claims.

BRIEF DESCRIPTION OF THE DRAWINGS

Aspects of the invention are described with reference to illustrative embodiments in which like numerals reference like elements, and wherein.

DETAILED DESCRIPTION

Figure 1:
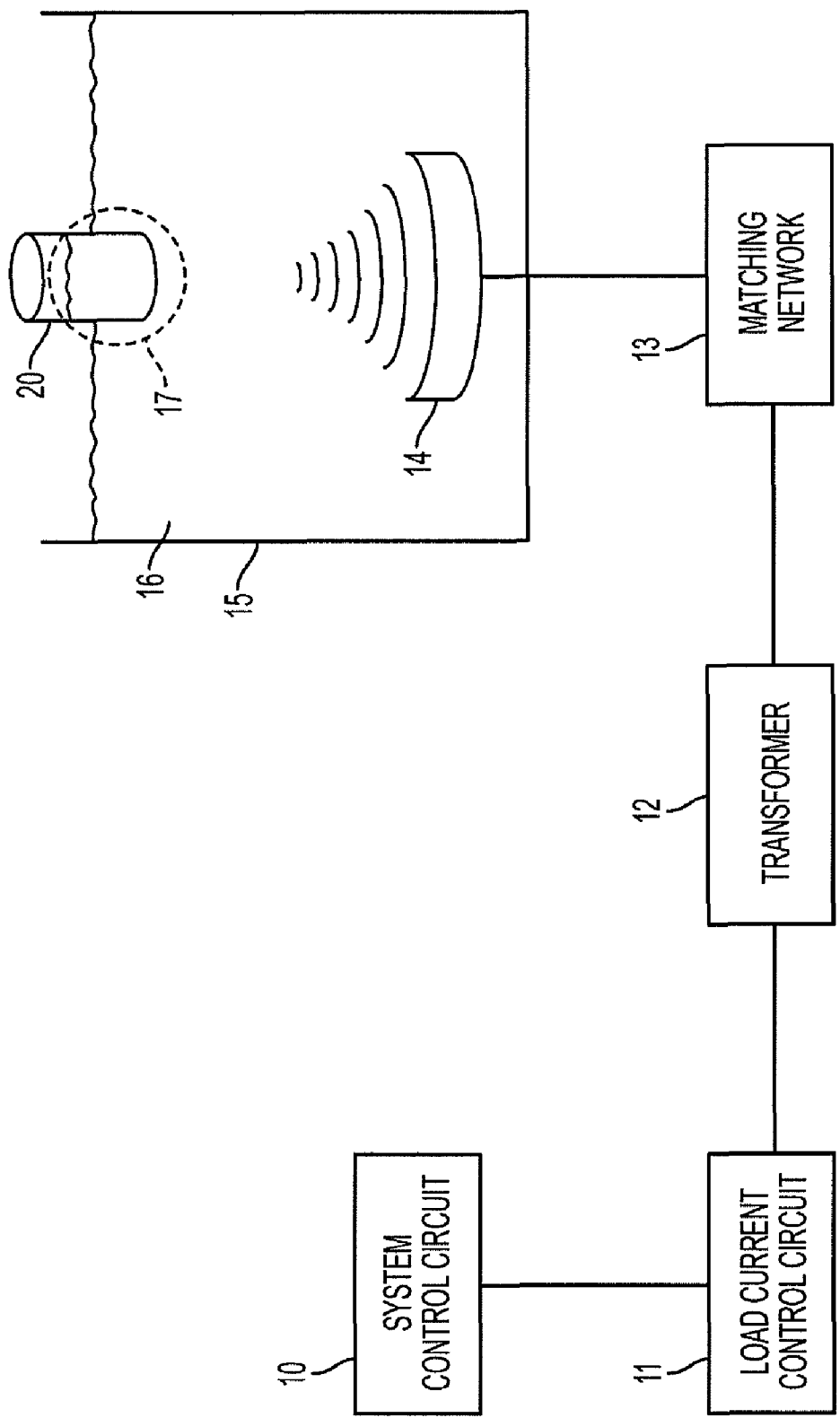
FIG. 1 shows a schematic block diagram of an acoustic treatment system in accordance with an aspect of the invention.

Aspects of the invention are described in relation to control of an acoustic transducer circuit in an acoustic treatment system suitable for causing cavitation and/or other affects in a liquid-containing sample. However, aspects of the invention may be used in connection with other applications, such as acoustic cleaning devices (e.g., for cleaning surfaces of a semiconductor wafer) or other arrangements in which an acoustic transducer is employed to generate an acoustic energy field.

The inventor has appreciated that proper generation of a load current used to generate a drive signal for an acoustic transducer may be important to help reduce noise generated by the system, reduce power requirements for the system, and/or provide other potential benefits. In one aspect of the invention, a load current for a transformer used to generate a drive signal for an acoustic transducer circuit can be controlled so as to reduce or eliminate one or more harmonic modes in the load current, e.g., a $3^{rd}$ harmonic mode. For example, the acoustic transducer may itself have a $3^{rd}$ harmonic mode that, if excited, causes undesirable $3^{rd}$ harmonic oscillation or other response of the transducer. By reducing or eliminating a $3^{rd}$ harmonic mode component from the load current, the drive signal generated from the load current will have a reduced or non-existent $3^{rd}$ harmonic mode component that could be passed on to the acoustic transducer. In one embodiment, the load current may be controlled to vary approximately sinusoidally and with a reduced or non-existent $3^{rd}$ harmonic mode. As a result, the acoustic transducer may be driven with a relatively smooth signal, potentially reducing noise that would otherwise be generated by the transducer.

In another aspect of the invention, a load current control circuit may control a load current in a primary winding of a transformer used to generate a drive signal for an acoustic transducer circuit so that the load current flows in a repeating cycle of three discrete modes. The three modes may include a forward current mode, during which a voltage bias (positive or negative in polarity) is applied across the primary winding, a zero voltage loop current mode, during which no voltage bias is applied to the primary winding and current in the primary winding flows in a closed loop, and a freewheel current mode, during which a voltage bias opposite that of the forward current mode is applied to the primary winding, but the load current flows in the same direction as in the forward current mode due to energy recovery from the transformer. In one embodiment, load current control employing a repeating cycle of the three modes may cause the load current to flow in an approximately sinusoidal fashion in the primary winding.

In yet another aspect of the invention, a load current control circuit may include an inverter circuit with four diode/switch pairs where each pair includes a switch with a diode connected across high-side and low-side terminals of the switch. The four diode/switch pairs may be arranged in an "H" or bridge circuit so that first and third diode/switch pairs have the high-side terminals of their switches connected together, second and fourth diode/switch pairs have the low-side terminals of their switches connected together, and so that the low-side terminal of the first diode/switch pair and the high-side terminal of the fourth diode/switch pair are both connected to a first terminal of a primary winding of a two-winding transformer, and the high-side terminal of the second diode/switch pair and low-side terminal of the third diode/switch pair are both connected to a second terminal of the primary winding of the two-winding transformer. A voltage bias, such as a controllable DC voltage bias, may be connected across the bridge circuit and the switches controlled so that a suitable drive signal is generated by the transformer (i.e., by the secondary winding) for an acoustic transducer circuit. In one embodiment, a load current in the primary winding may be caused to flow in an approximately sinusoidal fashion by controlling the open/closed state of the switches. The load current may also be controlled to reduce or eliminate $3^{rd}$ order (or other order) harmonic modes, e.g., without filtering. In embodiments discussed below, the switches are MOSFET devices, although any other suitable switch arrangement may be used, such as other semiconductor transistors, IGBTs, silicon-controlled rectifiers (SCRs), triacs, MCTs (MOS Controlled Thyristors), IGCTs (Integrated Gated Commutated Thyristors) or other thyristors, SITs (Static Induction Thyristors), hybrid power modules, and so on.

In another aspect of the invention, current may be permitted to flow in the primary winding of a transformer in a closed loop between periods when a positive or negative voltage bias is applied to the primary winding. For example, in some acoustic transducer control arrangements, the load current in the primary winding is controlled by alternately applying a negative and positive voltage bias across the primary winding. In some cases, such a control scheme may cause transient voltage spikes, noise or other undesirable affects. In some embodiments in accordance with aspects of the invention, energy stored in the transformer may be "released" between voltage bias applications by allowing current to flow in a closed loop for the primary winding when switching from one polarity voltage to another. This not only allows stored energy to be "recaptured," but also can help reduce voltage spikes, noise and/or other undesirable affects. Use of a closed loop for current flow in the primary winding may also be used to help damp the acoustic transducer, such as when seeking to stop or otherwise attenuate acoustic energy emission by the transducer.

FIG. 1 shows a schematic block diagram of an acoustic treatment system 100 that incorporates one or more aspects of the invention. It should be understood that although embodiments described herein may include most or all aspects of the invention, aspects of the invention may be used alone or in any suitable combination with other aspects of the invention. In this illustrative embodiment, the acoustic treatment system 100 includes an acoustic transducer 14 that is capable of generating an acoustic field suitable to cause cavitation and/or other affects in a liquid-containing sample in a vessel 20. The vessel 20 may have any suitable size or other arrangement, e.g., may be a glass tube, a plastic container, a well in a microtiter plate, a vial, or other. The system 100 may include a coupling medium container 15 that is capable of holding a medium 16 (such as water) which transmits acoustic energy from the transducer 14 to the vessel 20. The acoustic transducer 14 may generate an acoustic field such that a focal zone 17, e.g., an approximately spherical or ellipsoidal area having a width of about 2 cm or less, is positioned at the sample. In some embodiments, the acoustic field may be controlled, the acoustic transducer 14 may be moved, and/or the vessel 20 may be moved so that the sample is positioned in a desired location relative to the focal zone 17.

To control the acoustic transducer 14, the acoustic treatment system 100 may include a system control circuit 10 that controls various functions of the system 100 including operation of the acoustic transducer 14. As discussed in more detail below, the system control circuit 10 may control various acoustic treatment system 100 functions, such as positioning of the vessel 20 and/or acoustic transducer 14, receive operator input (such as commands for system operation), output information (e.g., to a visible display screen, indicator lights, sample treatment status information in electronic data form, and so on), and others. The system control circuit 10 may provide control signals (specifics described in more detail below) to a load current control circuit 11, which controls a load current in a winding of a transformer 12. Based on the load current in the winding, the transformer 12 may output a drive signal to a matching network 13 which is coupled to the acoustic transducer 14. As is understood in the art, the matching network 13 provides impedance matching between the transducer 14 and the load current control circuit 11 and/or suitable conditioning or adjustment of the drive signal received from the transformer 12 to cause the acoustic transducer 14 to generate a desired acoustic field. Generally speaking, the matching network 13 may provide (1) an inductive component that cancels the bulk capacitive component of the piezoelectric component(s) of the acoustic transducer 14, and/or (2) an impedance transform function that, when connected between the acoustic transducer 14 and the transformer 12, makes the acoustic transducer 14 look like a specified, "real" impedance (e.g., 40 Ohms in this illustrative embodiment), with a controlled tolerance, to the drive electronics through use of a transformer or auto-transformer configuration.

Regarding feature (1), relatively large piezoelectric transducers, such as those that might be found in the acoustic transducer 14, tend to have a large bulk capacitance in addition to the inductance and capacitance of the acoustically active part of the acoustic transducer 14. The inventor has found that when driving the acoustic transducer 14, a best operating frequency may correspond to the resonant frequency of the transducer 14, as determined by the acoustic equivalent LC (i.e., inductance and capacitance) of the piezoelectric component(s) of the transducer 14. However, driving a large capacitive load may consume significant current and result in a large amount of wasted power. Thus, the matching network 13 may contain an inductive element that is selected to resonate with the bulk capacitance of the piezoelectric component(s), e.g., at the same frequency as the equivalent electrical resonant frequency of the acoustic model, such that the reactive load of the bulk capacitance is essentially cancelled.

Regarding feature (2), when driven by an RF voltage source at the acoustic resonance of the acoustic transducer 14, the L and C components of the acoustic impedance may be effectively cancelled out, leaving a "real" or resistive component. This "resistance" may determine how much power is delivered by the acoustic transducer 14 at any given applied drive voltage. Normal variations in the manufacture of piezoelectric component(s) of the transducer 14 could cause the resistive component of the transducer impedance to vary over a fairly wide range—say 10 to 60 Ohms—a 6 to 1 range or more. Power is directly proportional to the square of the applied voltage; therefore, the driver may need to be able to deliver $\sqrt{6}$ or about 2.45 times more voltage to a 60 Ohm transducer than a 10 Ohm transducer to deliver the same acoustic power. This may present some serious design challenges for a cost effective driver design. Accordingly, the matching network 13 may be arranged to provide an impedance transfer function that makes the acoustic transducer 14 "look" like a real impedance. Note that these considerations regarding a matching network 13 may be true for this illustrative embodiment, and may vary for other embodiments, e.g., for other transducer types, as transducer frequencies get higher and transducer size decreases, the need for a matching network may be reduced and/or become unnecessary.

Figure 2:
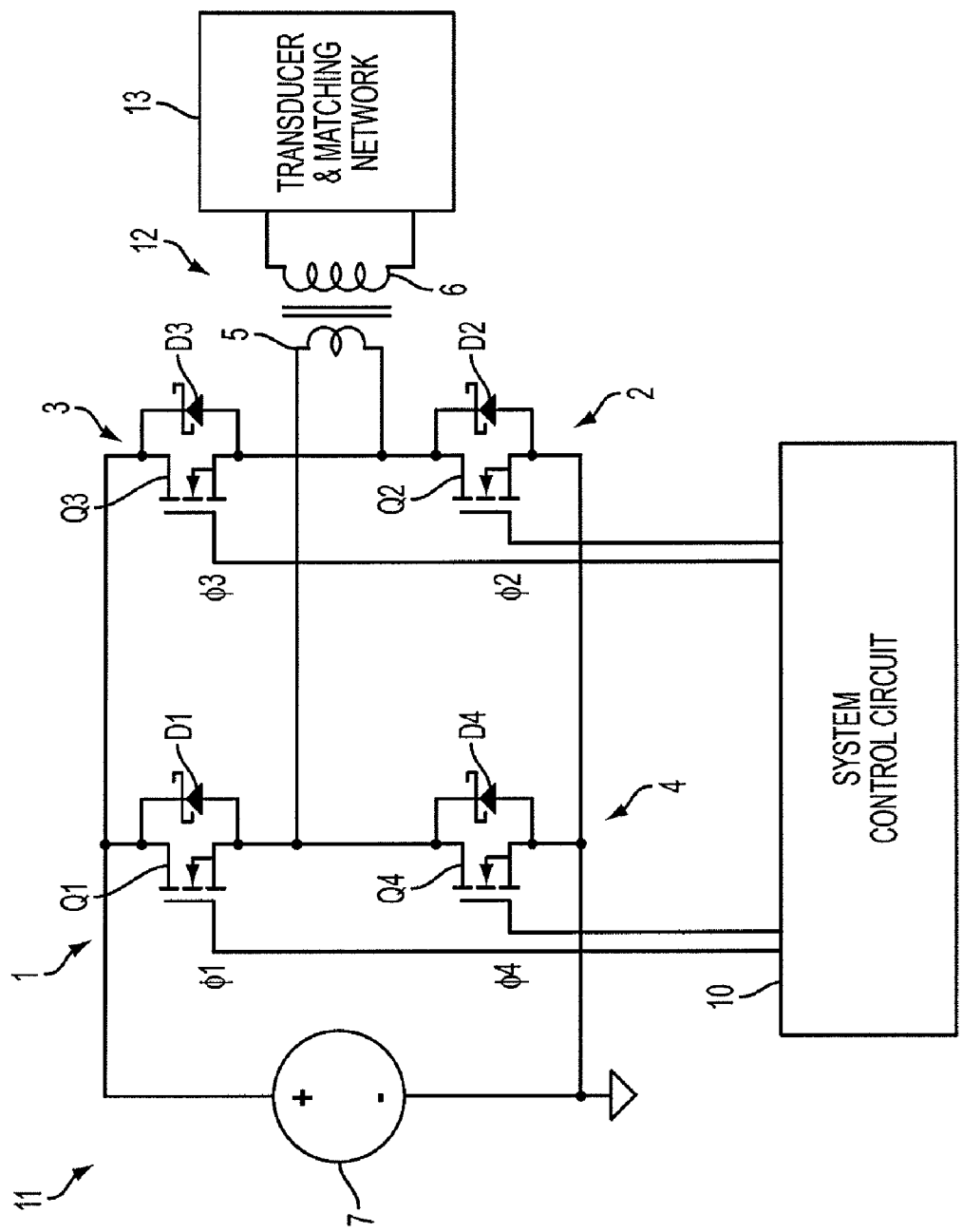
FIG. 2 shows a schematic diagram of a load current control circuit, transformer and matching network of an acoustic treatment system.

FIG. 2 shows a circuit diagram of an illustrative load current control circuit 11 and transformer 12 for the FIG. 1 embodiment. In this illustrative embodiment, the load current control circuit 11 includes an inverter circuit with four diode/switch pairs 1, 2, 3 and 4, where each switch has a diode D connected across high-side and low-side terminals of the switch Q. The four diode/switch pairs may be arranged in an "H" or bridge circuit so that first and third diode/switch pairs 1 and 3 have the high-side terminals of their switches Q1 and Q3 connected together, second and fourth diode/switch pairs 2 and 4 have the low-side terminals of their switches Q2 and Q4 connected together, and so that the low-side terminal of the first diode/switch pair 1 and the high-side terminal of the fourth diode/switch pair 4 are both connected to a first terminal of a primary winding 5 of a two-winding transformer 12. Also, the high-side terminal of the second diode/switch pair 2 and low-side terminal of the third diode/switch pair 3 are both connected to a second terminal of the primary winding 5 of the two-winding transformer 12. As used herein, a "high-side" terminal is a terminal that is connected to a relatively higher voltage bias, whereas a "low-side" terminal is a terminal that is connected to a relatively lower voltage bias. A current supply 7, such as a controllable DC voltage source, may be connected across the bridge circuit and the switches Q1-Q4 controlled so that a suitable drive signal is generated by the secondary winding of the transformer 12. The drive signal produced by the secondary winding of the transformer is provided to the matching network 13, which is coupled to the acoustic transducer 14. As will be understood, the transformer 12 may have any suitable winding ratio so as to provide desired RF voltage output for the drive signal.

Figure 3:
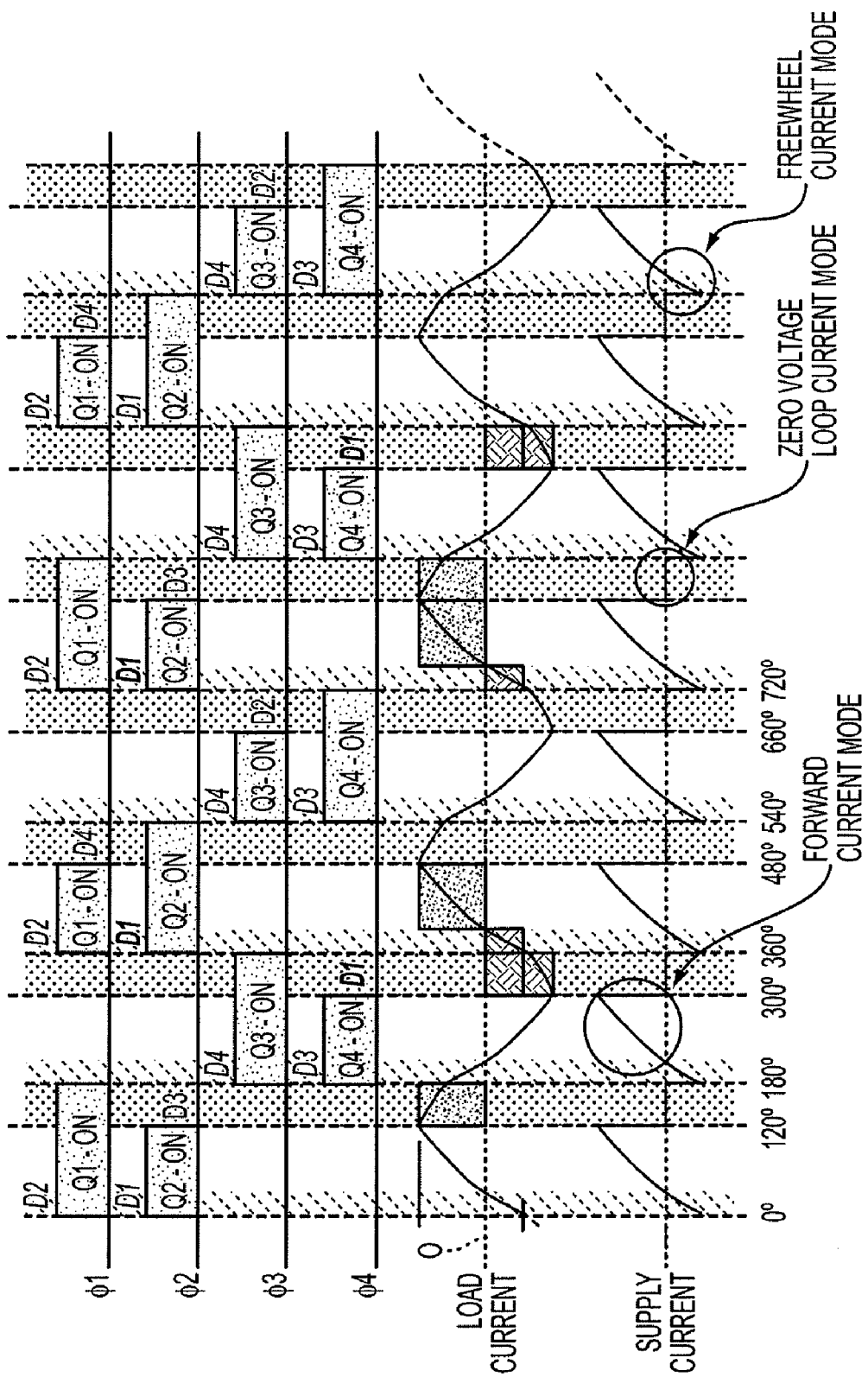
FIG. 3. shows a timing diagram for switch control of the load current control circuit and resulting load current in the primary winding of the transformer for the FIG. 2 embodiment.

In one aspect of the invention, a load current in the primary winding 5 may be caused to flow in an approximately sinusoidal fashion by controlling the open/closed state of the switches Q1-Q4. For example, FIG. 3 shows a timing diagram for the signals $\phi 1$-$\phi 4$ that are used by the system control circuit 10 to control the open/closed state of the switches Q1-Q4 so that an approximately sinusoidal load current in the primary winding of the transformer 12 results. Initially (at 0 degrees phase angle in this example), $\phi 1$ and $\phi 2$ are high such that switches Q1 and Q2 are closed, allowing current to pass through the switches. During this period (including a forward current mode), a positive voltage bias is applied across the primary winding 5 of the transformer 12 so that current flows through the switch Q1, through the primary winding, and through the switch Q2 to ground. As can be seen in FIG. 3, the load current in the primary winding 5 ramps up such that the curve has a concave-down shape (similar to that of a sine wave between 0 and 90 degrees phase angle).

Then (at 120 degrees phase angle in this example), the signal $\phi 2$ goes low, opening the switch Q2. However, the signal $\phi 1$ remains high so that the switch Q1 remains closed. During this period (a zero voltage loop current mode), no voltage bias is applied by the load current control circuit 11, and current in the primary winding is permitted to flow in a closed loop including the switch Q1, the primary winding 5 and the diode D3 of the third diode/switch pair 3. Thus, energy stored in the transformer 12 (e.g., in the form of a magnetic field induced by the load current), may be released through the closed loop. That is, as the magnetic field decays in the transformer 12, current flow in the primary winding slows in flowing from the first terminal of the primary winding (the connection point to the first and fourth diode/switch pair 1 and 4) to the second terminal of the primary winding (the connection point to the second and third diode/switch pair 2 and 3), but does not stop.

Next (at 180 degrees phase angle in this example), both $\phi 1$ and $\phi 2$ go low, opening switches Q1 and Q2, and $\phi 3$ and $\phi 4$ go high, closing switches Q3 and Q4. The initial portion of this cycle is a freewheel current mode in which energy stored in the transformer can be recovered even though a voltage bias opposite in polarity of that applied during the forward current mode is applied to the primary winding. That is, the magnetic field in the transformer 12 initially exerts a bias across the primary winding that overcomes the negative voltage bias applied by the switches Q3 and Q4 so that current continues to flow in a direction from the first terminal of the primary winding toward the second terminal of the primary winding and through the diodes D3 and D4. However, as the magnetic field in the transformer 12 further decays, the negative voltage bias applied across the primary winding by the closed switches Q3 and Q4 (from the second terminal to the first terminal of the primary winding 5) causes the current flow to stop and reverse direction as shown in FIG. 3 by the load current crossing the 0 voltage line and becoming negative. Once the load current becomes negative, the load current again enters a forward current mode although in this instance a negative voltage bias is applied across the primary winding 5.

Thereafter (at 300 degrees phase angle in this example), the signal φ4 goes low, opening switch Q4, while the switch Q3 remains closed. The circuit therefore enters a zero voltage loop current mode in which no voltage bias is applied by the load current control circuit 11 and the load current flows in a loop including the switch Q3, the primary winding 5 and the diode D1. Thereafter (at 360 degrees phase angle in this example), the switches Q1 and Q2 are again closed and the switches Q3 and Q4 are opened, initiating a freewheel current mode in which a positive voltage bias is applied across the primary winding 5, but the load current initially continues to flow from the second terminal to the first terminal of the primary winding 5 under the bias of a magnetic field of the transformer 12 until the load current stops and reverses direction, starting the three mode load current cycle over again.

In accordance with one aspect of the invention, the switches Q1-Q4 that are closed during the zero voltage loop current mode may alternate, e.g., so as to reduce heat build up that might otherwise occur if the same switches were used for every zero voltage loop current mode. For example, the first zero voltage loop current mode shown in FIG. 3 (between phase angles 120 and 180 degrees) involves closed switch Q1 and the diode D3. The second zero voltage loop current mode (between phase angles 300 and 360 degrees) involves closed switch Q3 and the diode D1. The third zero voltage loop current mode (between phase angles 480 and 540 degrees) involves not switch Q1 and diode D3, but instead closed switch Q2 and the diode D4. Similarly, the fourth zero voltage loop current mode (between phase angles 660 and 720 degrees) involves not switch Q3 and the diode D1, but rather closed switch Q4 and diode D2. In this way, load current flowing during the zero voltage loop current mode can flow in different components of the load current control circuit 11, helping to avoid overheating, increased resistance, and/or other characteristics.

Figure 4:
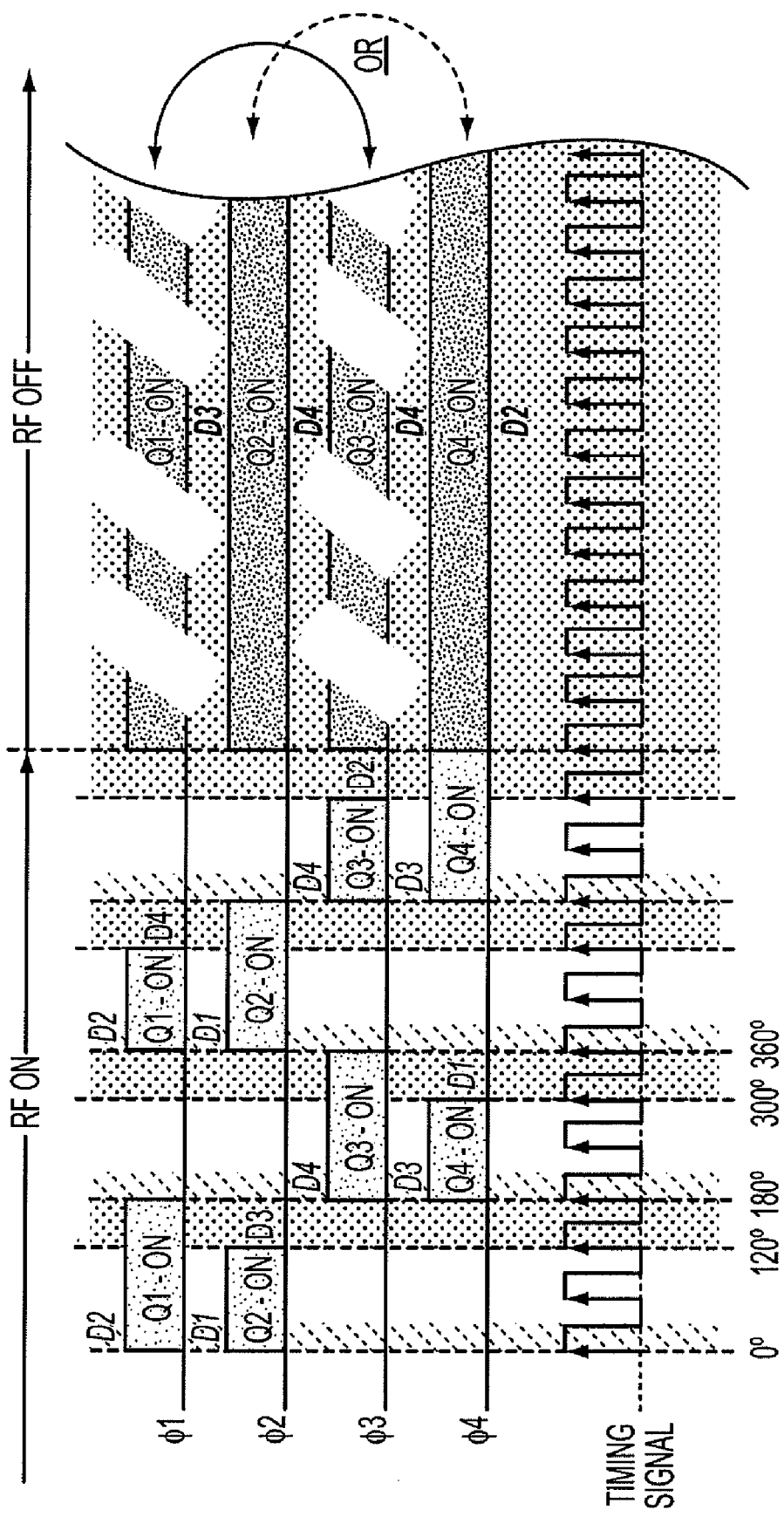
FIG. 4 shows a timing diagram for switch control with clock transitions and switch control for an RF Off/Damping period for the FIG. 2 embodiment.

As can be seen in FIG. 3, the load current varies approximately sinusoidally based on the control of the load current control circuit. Such variation of the load current may provide benefits, such as reduced noise in the system, more efficient operation, and possibly others. FIG. 4 shows a timing diagram for switch control with clock transitions and switch control for an RF Off/Damping period for the FIGS. 1-3 embodiment. In accordance with an aspect of the invention, a clock used to control switches of the load current control circuit 11 (and potentially other components) is arranged to provide timing pulses at a rate that is 6 times the frequency at which the load current varies. As shown in FIG. 4, switch state is controlled at rising clock transitions, e.g., the switches Q1 and Q2 are turned on at a first clock transition (0 degrees), Q2 is turned off at the third clock transition (120 degrees), Q1 is turned off and Q3 and Q4 are turned on at a fourth clock transition (180 degrees), Q4 is turned off at a sixth clock transition (300 degrees), and so on.

By controlling the switches of the load current control circuit in this way, a $3^{rd}$ harmonic mode in the load current (and thus in the drive signal output by the transformer 12), may be substantially reduced or eliminated. That is, by applying a voltage bias (e.g., a positive bias) across the primary winding 5 of the transformer 12 for 120 degrees phase angle, followed by applying a zero voltage bias across the primary winding 5 for 60 degrees phase angle, followed by again applying a voltage bias (e.g., a negative bias) for 120 degrees phase angle, followed by applying a zero voltage bias for 60 degrees phase angle, and so on, a $3^{rd}$ harmonic mode may be reduced or eliminated from the load current. (Other higher order harmonic modes may be reduced or eliminated as well, including $9^{th}$, $15^{th}$, etc., harmonic modes.) The inventor has found that controlling the load current, and thus the drive signal output by the transformer 12, to have a reduced $3^{rd}$ order harmonic mode may improve the operation of the acoustic transducer, particularly if the acoustic transducer has a $3^{rd}$ order harmonic mode itself. However, it should be understood that other clock timing, switch control rates, and/or voltage bias application timing could be used so as to control other harmonic modes in the load current and drive signal. For example, controlling the voltage bias applied to the primary winding 5 such that a forward bias is applied for 135 degrees phase angle, followed by a zero bias for 45 degrees phase angle, followed by a forward bias for 135 degrees phase angle, and so on, will tend to balance the $3^{rd}$ and $5^{th}$ order harmonic modes. Such a control arrangement may provide benefits for certain types of acoustic or other transducers, and may be achieved using a modulo-eight clock timing. Thus, the load current control circuit 11 and/or other components of the system may be controlled in ways other than the specific embodiment described above.

In accordance with another aspect of the invention, the load current control circuit may provide a damping function for an acoustic transducer or other component coupled to the transformer. For example, and as shown in FIG. 4 for the RF OFF period, the switches Q1 and Q3, or the switches Q2 and Q4, may be closed so as to provide a loop for current in the primary winding 5 of the transformer to flow. This arrangement may be useful when seeking to attenuate or stop output from the acoustic transducer, since any signal output by the acoustic transducer to the transformer due to transducer oscillation or other movement may induce current flow in the closed loop formed by the primary winding and the switches Q1 and Q3 (or Q2 and Q4), thereby reducing any potential feedback to the acoustic transducer and damping its movement. Another damping effect could be provided by closing one of the switches, such as Q1, and leaving the other switches open. This provides a current loop, e.g., including the switch Q1, the diode D3 and the primary winding 5, to receive energy from the transformer 12 and damp any movement of the acoustic transducer.

As described above, the system control circuit 10 may include any suitable components to perform desired control, communication and/or other functions. For example, the system control circuit 10 may include one or more general purpose computers, a network of computers, one or more microprocessors, etc. for performing data processing functions, one or more memories for storing data and/or operating instructions (e.g., including volatile and/or non-volatile memories such as optical disks and disk drives, semiconductor memory, magnetic tape or disk memories, and so on), communication buses or other communication devices for wired or wireless communication (e.g., including various wires, switches, connectors, Ethernet communication devices, WLAN communication devices, and so on), software or other computer-executable instructions (e.g., including instructions for carrying out functions related to controlling the load current control circuit as described above and other components), a power supply or other power source (such as a plug for mating with an electrical outlet, batteries, transformers, etc.), relays and/or other switching devices, mechanical linkages, one or more sensors or data input devices (such as a sensor to detect a temperature and/or presence of the medium 16, a video camera or other imaging device to capture and analyze image information regarding the vessel 20 or other components, position sensors to indicate positions of the acoustic transducer 14 and/or the vessel 20, and so on), user data input devices (such as buttons, dials, knobs, a keyboard, a touch screen or other), information display devices (such as an LCD display, indicator lights, a printer, etc.), and/or other components for providing desired input/output and control functions.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

The invention claimed is:

1. A system for controlling an acoustic transducer, comprising:
   a two-winding transformer that includes a primary winding and a secondary winding;
   a load current control circuit including a plurality of transistor switches and a plurality of diodes connected to the primary winding of the two-winding transformer;
   a voltage supply connected to the load current control circuit; and
   a control circuit that controls the plurality of transistor switches such that a load current in the primary winding varies substantially sinusoidally between negative and positive values and such that the load current flows in a closed loop when a zero voltage bias is applied by the load current control circuit across the primary winding, wherein the control circuit controls the transistor switches based on a timing equal to 6 times a frequency of the sinusoidal variation of the load current.

2. The system of claim 1, wherein the load current control circuit includes:
   an inverter circuit including four diode/switch pairs, each pair having a diode connected across high-side and low-side terminals of a corresponding switch, wherein:
      first and third diode/switch pairs have the high-side terminals of their switches connected together,
      second and fourth diode/switch pairs have the low-side terminals of their switches connected together,
      the low-side terminal of the first diode/switch pair and the high-side terminal of the fourth diode/switch pair are connected together and connected to a first terminal of a primary winding of a two-winding transformer that is coupled to an acoustic transducer circuit; and
      the high-side terminal of the second diode/switch pair and low-side terminal of the third diode/switch pair are connected together and connected to a second terminal of the primary winding of the two-winding transformer.

3. The system of claim 2, wherein the control circuit controls the switches of the diode/switch pairs such that the load current in the primary winding of the two-winding transformer flows in three discrete modes including a forward current mode, a zero voltage loop current mode, and a freewheel current mode.

4. The system of claim 1, wherein the control circuit controls the plurality of transistor switches such that a load current in the primary winding flows in a closed loop between periods when a positive and a negative voltage bias is applied across the primary winding.

5. The system of claim 1, wherein the secondary winding of the two-winding transformer is coupled to an acoustic transducer circuit including an acoustic transducer arranged to create an acoustic waveform suitable to cause cavitation in a liquid in a vessel located remote from the acoustic transducer.

6. The system of claim 1, wherein the control circuit controls the load current control circuit so that a $3^{rd}$ order harmonic mode is reduced or eliminated from the load current.

7. The system of claim 1, wherein the voltage supply is a controllable DC voltage supply.

8. The system of claim 1, wherein the control circuit controls the transistor switches so that the load current varies approximately sinusoidally, and so that a positive voltage bias is applied to the primary winding for approximately 120 degrees of a 360 degree cycle, followed by a zero voltage bias applied to the primary winding for approximately 60 degrees of the 360 degree cycle, followed by a negative voltage bias applied to the primary winding for approximately 120 degrees of the 360 degree cycle, followed by a zero voltage bias applied to the primary winding for approximately 60 degrees of the 360 degree cycle.

9. A system for controlling an acoustic transducer, comprising:
   an inverter circuit including four diode/switch pairs, each pair having a diode connected across high-side and low-side terminals of a corresponding switch, wherein:
      first and third diode/switch pairs have the high-side terminals of their switches connected together,
      second and fourth diode/switch pairs have the low-side terminals of their switches connected together,
      the low-side terminal of the first diode/switch pair and the high-side terminal of the fourth diode/switch pair are connected together and connected to a first terminal of a primary winding of a two-winding transformer that is coupled to an acoustic transducer circuit; and
      the high-side terminal of the second diode/switch pair and low-side terminal of the third diode/switch pair are connected together and connected to a second terminal of the primary winding of the two-winding transformer; and
   a control circuit that controls opening and closing of the switches of the diode/switch pairs to control current flow through the primary winding of the two-winding transformer,
   wherein the control circuit is arranged to control the switches of the diode/switch pairs such that a load current in the primary winding of the two-winding transformer varies approximately sinusoidally and such that a $3^{rd}$ order harmonic mode of the load current is substantially eliminated.

10. The system of claim 9, wherein the two-winding transformer is a tightly coupled two-winding transformer.

11. The system of claim 10, wherein a first terminal of the secondary winding of the two-winding transformer is connected to a first terminal of an acoustic transducer circuit, and a second terminal of the secondary winding of the two-winding transformer is connected to a second terminal of the acoustic transducer circuit.

12. The system of claim 11, wherein the acoustic transducer circuit includes a matching network connected to the transformer and at least one acoustic transducer arranged to generate an acoustic waveform in response to a suitable drive signal received from the matching network.

13. The system of claim 11, further comprising:
a controllable voltage supply connected across the high-side terminals of the first and third diode/switch pairs and the low-side terminals of the second and fourth diode/switch pairs.

14. The system of claim 13, wherein when the switches of the first and second diode/switch pairs are closed, positive sinusoidal current begins to rise and flow through the primary winding of the two-winding transformer and both switches.

15. The system of claim 14, wherein when the switch of the second diode/switch pair is opened, leaving the switch of first diode/switch pair closed, positive sinusoidal current continues to flow through the primary winding of the two-winding transformer and through the diode of the third diode/switch pair.

16. The system of claim 15, wherein when the switches of the third and fourth diode/switch pairs are closed and the switch of the first diode/switch pair is opened, a remainder of the positive sinusoidal phase current continues to flow through the primary winding of the two-winding transformer and through the diodes of the third and fourth diode/switch pairs.

17. The system of claim 16, wherein, with the switches of the third and fourth diode/switch pairs still closed and the positive phase sinusoidal current completed, a negative phase current begins to flow through the primary winding of the two-winding transformer and the switches of the third and fourth diode/switch pairs.

18. The system of claim 17, wherein when the switch of the fourth diode/switch pair is opened, leaving the switch of third diode/switch pair closed, negative sinusoidal current continues to flow through the primary winding of the two-winding transformer and through the diode of the first diode/switch pair.

19. The system of claim 18, wherein when the switches of the first and second diode/switch pairs are closed, the remainder of the negative sinusoidal phase current continues to flow through the primary winding of the two-winding transformer and through the diodes of the first and second diode/switch pairs.

20. The system of claim 19, wherein the switch of one of the third and fourth diode/switch pairs is opened and the switch of the other of the third and fourth diode/switch pair remains closed during a period immediately before the switches of the first and second diode/switch pairs are closed.

21. The system of claim 9, wherein the control circuit is arranged to provide control signals to the switches of the diode/switch pairs such that the switches of the first and second diode/switch pairs are closed while the switches of the third and fourth diode/switch pairs are open, and vice versa.

22. The system of claim 21, wherein the switch of one of the first and second diode/switch pairs is opened and the switch of the other of the first and second diode/switch pairs remains closed during a period immediately before the switches of the third and fourth diode/switch pairs are closed.

23. The system of claim 9, wherein the control circuit controls the switches of the diode/switch pairs such that current flows in the transformer winding in three discrete modes including a forward current mode, a zero voltage loop current mode, and a freewheel current mode.

24. The system of claim 23, wherein the control circuit controls the switches of the diode/switch pairs such that current flows in the transformer in the three discrete modes in a repeating cycle.

25. An acoustic treatment system comprising:
the inverter circuit of claim 9; and
an acoustic transducer circuit, including an acoustic transducer, connected to the inverter circuit to receive a drive signal from the inverter circuit;
wherein the acoustic transducer is arranged to provide an acoustic waveform to a vessel containing a liquid so as to cause cavitation in the liquid.

26. A method for controlling an acoustic transducer circuit, comprising:
controlling a load current in a primary winding of a two-winding transformer used to provide a drive signal to the acoustic transducer circuit so as to cause an acoustic transducer of the acoustic transducer circuit to create an acoustic waveform suitable to cause mixing in a liquid in a vessel located remote from the acoustic transducer, control of the load current being performed so as to cause the load current to vary approximately sinusoidally and to substantially reduce or eliminate a $3^{rd}$ order harmonic mode in the load current.

27. The method of claim 26, wherein the step of controlling includes:
controlling the load current in the primary winding of the two-winding transformer to flow in three discrete modes including a forward current mode, a zero voltage loop current mode, and a freewheel current mode, and
controlling current flow in the primary winding of the two-winding transformer such that the three discrete modes occur in a repeating cycle.

28. The method of claim 26, further comprising:
creating an acoustic waveform from the acoustic transducer suitable to cause cavitation in a liquid in a vessel located remote from the acoustic transducer.

29. A method for controlling an acoustic transducer circuit, comprising:
controlling a load current in a primary winding of a two-winding transformer used to provide a drive signal to the acoustic transducer circuit so as to cause an acoustic transducer of the acoustic transducer circuit to create an acoustic waveform suitable to cause cavitation in a liquid in a vessel located remote from the acoustic transducer, control of the load current being performed so as to substantially reduce or eliminate a $3^{rd}$ order harmonic mode in the load current.

* * * * *